(12) United States Patent
Botula et al.

(10) Patent No.: US 9,257,324 B2
(45) Date of Patent: Feb. 9, 2016

(54) FORMING STRUCTURES ON RESISTIVE SUBSTRATES

(71) Applicant: International Business Machines Corporation, Armonk, NY (US)

(72) Inventors: Alan B. Botula, Essex Junction, VT (US); Renata Camillo-Castillo, Essex Junction, VT (US); James S. Dunn, Jericho, VT (US); Jeffrey P. Gambino, Westford, VT (US); Douglas B. Hershberger, Essex Junction, VT (US); Alvin J. Joseph, Williston, VT (US); Robert M. Rassel, Colchester, VT (US); Mark E. Stidham, Bloomington, IN (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 158 days.

(21) Appl. No.: 14/230,206

(22) Filed: Mar. 31, 2014

(65) Prior Publication Data

US 2014/0213036 A1     Jul. 31, 2014

Related U.S. Application Data

(62) Division of application No. 13/312,442, filed on Dec. 6, 2011, now Pat. No. 8,735,986.

(51) Int. Cl.
*H01L 27/04* (2006.01)
*H01L 21/762* (2006.01)
*H01L 21/8238* (2006.01)
(Continued)

(52) U.S. Cl.
CPC .. *H01L 21/76224* (2013.01); *H01L 21/823892* (2013.01); *H01L 27/04* (2013.01); *H01L 27/0635* (2013.01); *H01L 21/26506* (2013.01); *H01L 27/0623* (2013.01); *H01L 27/0802* (2013.01); *H01L 27/0811* (2013.01); *H01L 27/0928* (2013.01)

(58) Field of Classification Search
CPC .............. H01L 21/76224; H01L 27/04; H01L 27/76224; H01L 27/0635; H01L 27/26506
See application file for complete search history.

(56) References Cited

U.S. PATENT DOCUMENTS

| 3,751,722 A | 8/1973 | Richman |
|---|---|---|
| 4,314,857 A | 2/1982 | Aitken |

(Continued)

FOREIGN PATENT DOCUMENTS

| EP | 0880165 A1 | 11/1998 |
|---|---|---|
| JP | 59002317 A | 1/1984 |

(Continued)

OTHER PUBLICATIONS

International Search Report and Written Opinion for International Application No. PCT/US12/59428; International Filing Date: Oct. 10, 2012; Date of mailing: Dec. 20, 2012; 9 pages.

*Primary Examiner* — Matthew Reames
(74) *Attorney, Agent, or Firm* — Cantor Colburn LLP

(57) ABSTRACT

A substrate includes a first region having a first resistivity, for optimizing a field effect transistor, a second region having a second resistivity, for optimizing an npn subcollector of a bipolar transistor device and triple well, a third region having a third resistivity, with a high resistivity for a passive device, a fourth region, substantially without implantation, to provide low perimeter capacitance for devices.

17 Claims, 2 Drawing Sheets

(51) Int. Cl.
*H01L 21/265* (2006.01)
*H01L 27/06* (2006.01)
*H01L 27/08* (2006.01)
*H01L 27/092* (2006.01)

(56) References Cited

U.S. PATENT DOCUMENTS

| | | | |
|---|---|---|---|
| 4,987,089 A | 1/1991 | Roberts | |
| 5,079,182 A | 1/1992 | Ilderem et al. | |
| 5,198,371 A | 3/1993 | Li | |
| 5,270,227 A | 12/1993 | Kameyama et al. | |
| 7,238,584 B2 | 7/2007 | Chun | |
| 7,381,624 B2 | 6/2008 | Wei et al. | |
| 7,745,279 B2 | 6/2010 | Yeo et al. | |
| 2003/0183880 A1 | 10/2003 | Goto et al. | |
| 2004/0043558 A1* | 3/2004 | Wieczorek et al. | 438/241 |
| 2004/0222436 A1 | 11/2004 | Joseph et al. | |
| 2004/0227183 A1* | 11/2004 | Negoro et al. | 257/338 |
| 2009/0250726 A1 | 10/2009 | Kurjanowicz | |
| 2009/0267182 A1 | 10/2009 | Jacqueline | |
| 2010/0052060 A1 | 3/2010 | Lai et al. | |

FOREIGN PATENT DOCUMENTS

| | | | |
|---|---|---|---|
| JP | 1135016 A | 5/1989 | |
| JP | 1158749 A | 6/1989 | |
| JP | 5075109 A | 3/1993 | |
| JP | 2001196308 A | 7/2001 | |

* cited by examiner

FORMING STRUCTURES ON RESISTIVE SUBSTRATES

CROSS-REFERENCE TO RELATED APPLICATION

This application is a divisional of U.S. patent application Ser. No. 13/312,442, filed Dec. 6, 2011, the disclosure of which is incorporated by reference herein in its entirety.

BACKGROUND

The present invention relates to complementary metal oxide semiconductors, and more specifically, to fabricating structures on resistive substrates.

Structures and devices such as, transistors, capacitors, inductors, resistors, and diodes are often formed on semiconductor substrates that include, for example, silicon or germanium.

BRIEF SUMMARY

According to one embodiment of the present invention, a substrate includes a first region having a first resistivity, for optimizing a field effect transistor, a second region having a second resistivity, for optimizing an npn subcollector of a bipolar transistor device and triple well, a third region having a third resistivity, with a high resistivity for a passive device, a fourth region, substantially without implantation, to provide low perimeter capacitance for devices.

According to another embodiment of the present invention, a device includes a substrate including a first region having a first resistivity, a second region having a second resistivity, and a third region having a third resistivity, wherein the first resistivity is optimized for the wells of field effect transistors, the second resistivity is optimized for an npn subcollector of a bipolar transistor device and for a triple well device, and the third region has a resistivity that is optimized for passive devices.

According to yet another embodiment of the present invention, a method for fabricating a substrate includes implanting p-type ions in a first region of the substrate that decrease the resistivity of the first region, implanting n-type ions in a second region of the substrate, implanting argon ions in a third region of the substrate that decrease carrier mobility of the third region of the substrate. In a fourth region, there is no ion implantation, to minimize the perimeter capacitance of the subcollector and the triple well.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Semiconductor processing devices formed on semiconductor substrates often include a variety of structures such as, for example, complementary metal oxide (CMOS) devices, field effect transistor (FET) devices, and other types of devices often referred to generally as "active devices." Other structures may include for example, resistors, capacitors, conductive lines, and inductors that are often generally referred to as passive devices. Such devices often have different performance characteristics depending on the characteristics of the substrate underlying the devices. For example, inductors may exhibit better performance when formed on a substrate having relatively high resistivity, while a CMOS device may exhibit better performance when formed on a substrate having relatively lower resistivity. Since a variety of different devices may be formed on a single substrate, it is desirable to vary the resistivity in portions of the substrate such that devices may be formed in portions of the substrate having a resistivity that will improve the performance of each device.

In this regard typical semiconductor substrates include impurities such as boron or phosphorous that may be introduced into the substrate from, for example, raw materials and processes used to fabricate the substrate. The presence of the dopants in the substrate tends to lower the resistivity of the substrate. The resistivity of a substrate may also be reduced or increased by controlling an amount of impurities or dopants present when the substrate is fabricated. A lower resistivity substrate is often desirable when, for example, CMOS devices are formed on the substrate. However, as discussed above, some devices such as, for example, inductors exhibit improved performance when the devices are formed on a substrate with high resistivity. Thus, for a substrate having a given resistivity following fabrication, it may be desirable to change the resistivity of regions of the substrate.

One method for increasing the resistivity of a substrate is to implant a dopant such as, for example, Ar, Kr, Ze, O, N in the substrate. The argon degrades the mobility of the substrate resulting in a high resistivity (e.g., >1000 ohm-cm for a silicon substrate). Another method to increase the resistivity of the top of the substrate is to form deep trenches, 1 to 10 um deep.

A method for decreasing the resistivity of a p-type substrate may include implanting a dopant such as, for example, boron or aluminum into the substrate. The dopant increases the free carrier concentration of the substrate resulting in a lower resistivity (e.g., 30-70 ohm-cm for a silicon substrate).

Figure 1A:
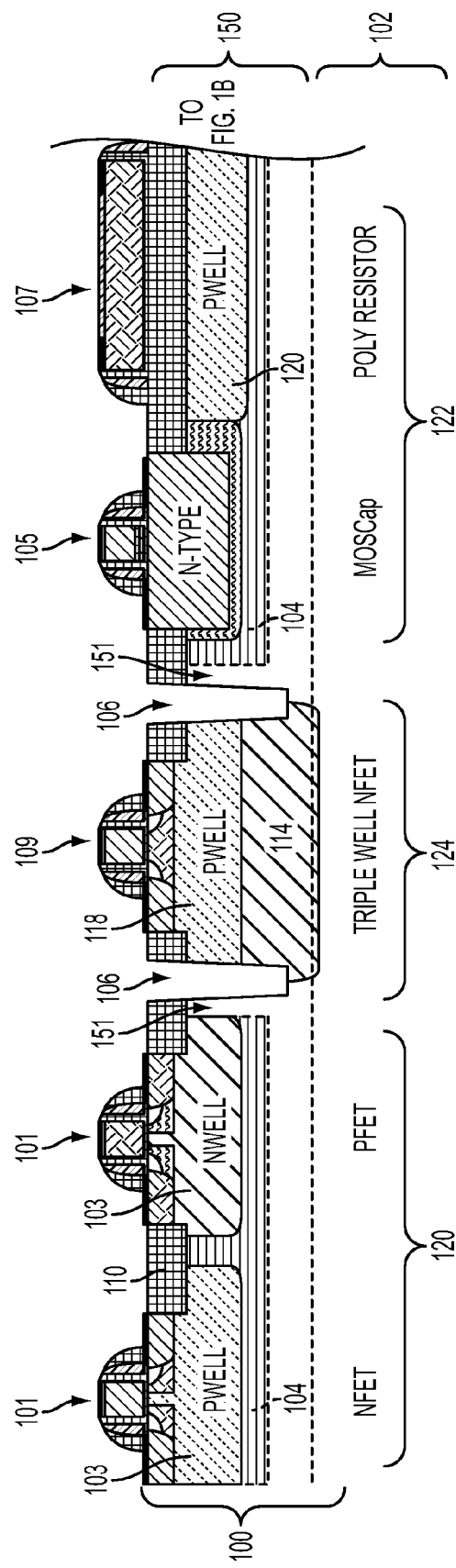
FIGS. 1A and 1B illustrate a cross-sectional view of a portion of a substrate.

FIG. 1A illustrates a cross-sectional view of a portion of a substrate 100. The substrate 100 includes an intrinsic region 102 that includes dopants or impurities resulting from the materials and fabrication process used to fabricate the substrate 100. In the illustrated embodiment the substrate 100 is formed from silicon materials, alternate embodiments may include other materials such as, for example, germanium. An n-type triple well, 114, is formed in the substrate. An "undoped" epitaxial Si layer 150, is grown on the substrate, and may be inadvertently doped with n-type dopant from subcollector. A shallow trench isolation structure 110 may be formed on portions of the substrate. The substrate 100 includes boron tub regions 104 that are formed by implanting a dopant such as, for example boron or aluminum in the substrate 100. In the boron tub region 104. The boron tub regions reduce the resistivity of the substrate to 1-100 ohm-cm, in the illustrated exemplary embodiment, the boron tub regions 104 reduce the resistivity of the substrate to 30 to 70 ohm-cm. In the illustrated embodiment, an NFET and PFET device 101 has been formed on the substrate 100 on a tub region 104. The wells 103 of the devices 101 are arranged in the tub region 104. A metal oxide semiconductor capacitor device 105 and a resistor device 107 have been formed in a second tub region 104. A triple well FET 109 has been formed in a portion 102 of the substrate that does not include a doped tub region 104 (The region may be formed by, for example, obscuring portions of the substrate 100 with a patterned resist or hardmask material prior to implanting the dopants into the tub regions 104. The NFET and PFET devices 101; the triple well FET 109; and the metal oxide semiconductor capacitor device 105 and a polysilicon resistor device 107 are separated by trench isolation (TI) regions 106. The TI regions 106 remove portions of the substrate 100 that include dopants and reduce the parasitic capacitance in the FET devices 101 and 109. The TI regions 106 partially define regions of the substrate 100 having different resistivity. FIG. 1A, includes three different regions of substrate doping; boron tub regions 104 (having a resistivity of approximately 30 to 70 ohm-cm), triple well regions, 114 and 124 (having a resistivity of approximately 0.001 to 0.1 ohm-cm), and undoped regions, 151, having a resistivity of 50 to 1000 ohm-cm.

Figure 1B:
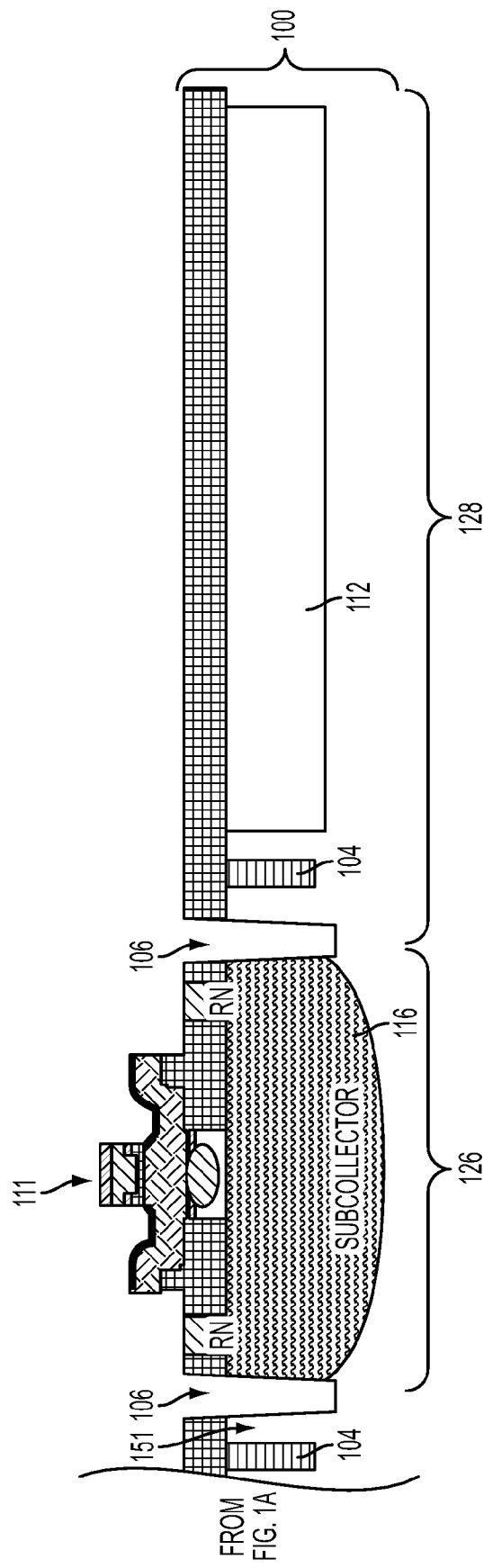

FIG. 1B illustrates another portion of the substrate 100. The TI regions 106 partially define doping regions 126, 128, and, 151, of the substrate 100. A bipolar transistor 111 has been formed in region 126, which is a region of the substrate 100 without the dopants that define the tub regions 104 (of FIG. 1A). The bipolar transistor 111 has been formed over a subcollector region 116 formed in the substrate 100 that has a resistivity of approximately 0.001 to 0.1 ohm-cm). The subcollector 116 uses a similar or the same doping as the triple well, 114, in FIG. 1A. Region 128 includes a region 112 implanted with a dopant that results in a high resistivity such as, for example, 500 to 5000 ohm-cm. In the illustrated embodiment the resistivity of the region 112 is approximately 1000 to 3000 ohm-cm. A dopant such as, for example, argon increases the resistivity of the fourth region 128 of the substrate 100 by damaging the lattice structure of the substrate. Alternatively, the high resistivity region 112 can consist of one or more deep trenches. (not shown). Devices such as, for example, inductors may be formed in the region 128 and benefit from the increased resistivity of the region 128 of the substrate 100. Region, 151, provides a relatively high resistivity for minimizing device capacitance, but with no implant damage, to minimize junction leakage. For example, in FIG. 1B, if Ar implanted region 112 was directly adjacent to subcollector 116, the capacitance would be low, but the junction leakage would be high.

The resistivities of the four regions are as follows. The resistivity of the first region, the boron tub, 104, is 1 to 100 ohm-cm. The second region, the triple well or the subcollector, 114 or 116, has the lowest resistivity, 0.001 to 0.1 ohm-cm. The third region, the passive device region 112 has the highest resistivity, 500 to 5000 ohm-cm. The fourth region, the unimplanted region, 151, has a resistivity of 50 to 1000 ohm-cm, which is less than the passive device region, 112, but greater than boron tub region 104.

The higher resistivity of the third region 112 has been shown to reduce insertion loss in devices formed in regions with high resistivity.

The methods and arrangements described above provide for changing the resistance of regions of a substrate, and forming trench isolation regions to further define regions having different resistivities. The combination of the different resistivity regions and the trench isolation regions defining the different resistivity regions improves the performance of devices formed in the respective regions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of forming a substrate, the method comprising:
    forming an intrinsic region;
    forming a first region having a first resistivity, for accommodating a field effect transistor;
    forming a second region having a second resistivity, for accommodating an npn subcollector of a bipolar transistor device and triple well;
    forming a third region having a third resistivity, for accommodating a passive device; and
    forming a fourth region, substantially without implantation, to provide low perimeter capacitance for devices, the fourth region comprising a portion of the intrinsic region;
    wherein the resistivity of the first region is between 1 ohm-cm and 100 ohm-cm and includes dopant materials to lower its resistivity with respect to the intrinsic region, the resistivity of the second region is between 0.001 and 0.1 ohm-cm, the resistivity of the third region is between 500 and 5000 ohm-cm and includes dopant materials to increase its resistivity with respect to the intrinsic region, and the resistivity of the fourth region and the intrinsic region is about 1000 ohm-cm.

2. The method of claim 1, wherein the substrate includes a silicon material.

3. The method of claim 1, wherein the substrate includes a first trench isolation region disposed between the first region and the second region.

4. The method of claim 1, wherein the substrate includes a second trench isolation region disposed between the second region and the third region.

5. The method of claim 1, wherein the first region includes implanted p-type ions.

6. The method of claim 1, wherein the third region includes implanted argon ions.

7. The method of claim 1, wherein the first region includes a boron tub region serving as a doped region.

8. A method of forming a semiconductor device, the method comprising:
   forming a substrate, the substrate including:
   an intrinsic region;
   a first region having a first resistivity, for accommodating a field effect transistor;
   a second region having a second resistivity, for accommodating an npn subcollector of a bipolar transistor device and triple well;
   a third region having a third resistivity, for accommodating a passive device; and
   a fourth region, substantially without implantation, to provide low perimeter capacitance for devices, the fourth region comprising a portion of the intrinsic region;
   wherein the resistivity of the first region is between 1 ohm-cm and 100 ohm-cm and includes dopant materials to lower its resistivity with respect to the intrinsic region, the resistivity of the second region is between 0.001 and 0.1 ohm-cm, the resistivity of the third region is between 500 and 5000 ohm-cm and includes dopant materials to increase its resistivity with respect to the intrinsic region, and the resistivity of the fourth region and the intrinsic region is about 1000 ohm-cm.

9. The method of claim 7, wherein the device comprises a bipolar field effect transistor device disposed on the second region.

10. The method of claim 7, wherein the device comprises a passive device disposed on the third region.

11. The method of claim 7, wherein the substrate includes a silicon material.

12. The method of claim 7, wherein the substrate includes a first trench isolation region disposed between the first region and the second region.

13. The method of claim 7, wherein the substrate includes a second trench isolation region disposed between the second region and the third region.

14. The method of claim 7, wherein the first region includes implanted p-type ions.

15. The method of claim 7, wherein the third region includes implanted argon ions.

16. The method of claim 7, wherein the first region includes a boron tub region serving as a doped region.

17. The method of claim 7, wherein the second region includes a subcollector portion.

* * * * *